(12) United States Patent
Torikoshi et al.

(10) Patent No.: US 10,559,277 B2
(45) Date of Patent: Feb. 11, 2020

(54) NON-TRANSITORY COMPUTER-READABLE STORAGE MEDIUM STORING A PROGRAM OF SCREEN CONTROL AND SEMICONDUCTOR MANUFACTURING APPARATUS

(71) Applicant: EBARA CORPORATION, Tokyo (JP)

(72) Inventors: Tsuneo Torikoshi, Tokyo (JP); Takamasa Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 2 days.

(21) Appl. No.: 16/051,222

(22) Filed: Jul. 31, 2018

(65) Prior Publication Data

US 2019/0043443 A1 Feb. 7, 2019

(30) Foreign Application Priority Data

Aug. 4, 2017 (JP) .................................. 2017-151765

(51) Int. Cl.
*G09G 5/00* (2006.01)
*G06F 3/0482* (2013.01)
(Continued)

(52) U.S. Cl.
CPC ........... *G09G 5/006* (2013.01); *G05B 19/042* (2013.01); *G06F 1/1622* (2013.01);
(Continued)

(58) Field of Classification Search
CPC ........... G09G 5/006; G09G 2340/0442; G09G 2340/0464; G09G 2340/0492; G05B 19/042; G06F 1/1622; G06F 3/0482; G06F 3/04886; G06F 2200/1614; H01L 21/67092

See application file for complete search history.

(56) References Cited

U.S. PATENT DOCUMENTS 5,714,973 A * 2/1998 Takahashi ................ G09G 5/00
345/658
2009/0146994 A1* 6/2009 Goh ........................ G06T 11/60
345/418

(Continued)

FOREIGN PATENT DOCUMENTS

EP 3413547 A1 * 12/2018 ........... G06F 1/1618
JP H09-283395 A 10/1997
(Continued)

*Primary Examiner* — Phuc N Doan
(74) *Attorney, Agent, or Firm* — Baker Hostetler LLP

(57) ABSTRACT

A non-transitory computer-readable storage medium storing a program of screen control capable of improving the user-friendliness with respect to a semiconductor manufacturing apparatus is disclosed. The program of screen control causes a computer to perform operation of: judging whether or not a vertical screen resolution of a display screen is larger than a horizontal screen resolution of the display screen; and dividing a display area of the display screen into a main screen display area for displaying a monitoring image with respect to an operational status of a processing unit and a work area for displaying an operation image with respect to an operation of the processing unit when the vertical screen resolution is larger than the horizontal screen resolution.

8 Claims, 16 Drawing Sheets

(51) Int. Cl.
*G05B 19/042* (2006.01)
*H01L 21/67* (2006.01)
*G06F 1/16* (2006.01)
*G06F 3/0488* (2013.01)

(52) U.S. Cl.
CPC ........ *G06F 3/0482* (2013.01); *G06F 3/04886* (2013.01); *H01L 21/67092* (2013.01); *G06F 2200/1614* (2013.01); *G09G 2340/0442* (2013.01); *G09G 2340/0464* (2013.01); *G09G 2340/0492* (2013.01)

(56) References Cited

U.S. PATENT DOCUMENTS

| | | | | |
|---|---|---|---|---|
| 2011/0231791 A1* | 9/2011 | Itahana | ................ | G06F 1/1645 715/799 |
| 2011/0301463 A1* | 12/2011 | Fujii | .................... | A61B 8/4477 600/443 |
| 2013/0122944 A1* | 5/2013 | Yun | ...................... | H04W 4/023 455/466 |
| 2013/0239062 A1* | 9/2013 | Ubillos | .................. | H04L 51/24 715/838 |
| 2014/0184628 A1* | 7/2014 | Lee | ....................... | G06F 3/1423 345/545 |
| 2015/0074589 A1* | 3/2015 | Pan | ..................... | G06F 3/04886 715/781 |
| 2015/0192921 A1* | 7/2015 | Sugiyama | ............ | G05B 19/418 700/121 |
| 2015/0193424 A1* | 7/2015 | Lee | .......................... | G06F 9/44 715/763 |
| 2016/0179303 A1* | 6/2016 | Wagener | ................ | G06F 3/0482 715/810 |
| 2016/0224213 A1* | 8/2016 | Chen | ................... | G06F 3/04842 |
| 2016/0313963 A1* | 10/2016 | Kang | ...................... | G06F 3/011 |
| 2017/0139576 A1* | 5/2017 | Jeong | ................... | G06F 3/0346 |
| 2017/0358113 A1* | 12/2017 | Bray | ..................... | G06F 3/0482 |
| 2019/0042066 A1* | 2/2019 | Kim | ..................... | G06F 1/1647 |

FOREIGN PATENT DOCUMENTS

| | | |
|---|---|---|
| JP | 2009-117648 A | 5/2009 |
| JP | 2015-146413 A | 8/2015 |

* cited by examiner

NON-TRANSITORY COMPUTER-READABLE STORAGE MEDIUM STORING A PROGRAM OF SCREEN CONTROL AND SEMICONDUCTOR MANUFACTURING APPARATUS

CROSS REFERENCE TO RELATED APPLICATION

This document claims priority to Japanese Patent Application Number 2017-151765 filed Aug. 4, 2017, the entire contents of which are hereby incorporated by reference.

BACKGROUND

In a semiconductor manufacturing plant, many people are involved in a stable operation, maintenance, and a process of a semiconductor manufacturing apparatus. Therefore, a diversity of management matters as an object of a management of the semiconductor manufacturing apparatus and a diversity of people involved in such management matters are progressing.

However, even if the management matters such as a process adjustment (process tuning), maintenance, an overall optimization and the like of the semiconductor manufacturing apparatus are roughly divided, there are a plurality of management matters and a person in charge is different for each of these management matters.

Information to be seen, an operation target, and input information are different depending on the management matter and the person in charge. Therefore, if the management matter or the person in charge is changed, a target screen must be switched in each case, and there is a problem to the user-friendliness. Manageability of recipe data or the like on the semiconductor manufacturing apparatus is also important depending on a diversity of people involved in the management matters.

SUMMARY OF THE INVENTION

According to an embodiment, there is provided a non-transitory computer-readable storage medium storing a program of screen control and a semiconductor manufacturing apparatus capable of improving the user-friendliness with respect to the semiconductor manufacturing apparatus.

Embodiments, which will be described below, relate to a program of screen control and a semiconductor manufacturing apparatus.

In an embodiment, there is provided a non-transitory computer-readable storage medium storing a program of screen control configured to cause a computer to perform a screen display method applied to a display device comprising a rectangular display screen configured to display an image with respect to a processing unit, the program causing the computer to perform operations of: judging whether or not a vertical screen resolution of the display screen is larger than a horizontal screen resolution of the display screen; and dividing a display area of the display screen into a main screen display area for displaying a monitoring image with respect to an operational status of the processing unit and a work area for displaying an operation image with respect to an operation of the processing unit when the vertical screen resolution is larger than the horizontal screen resolution.

In an embodiment, causing the computer to perform the operations comprises causing the computer to perform operations of: judging whether or not the vertical screen resolution is larger than the horizontal screen resolution; and determining the display area as the main screen display area when the vertical screen resolution is smaller than the horizontal screen resolution.

In an embodiment, the operation image is a plurality of operation images, and wherein causing the computer to perform the operations comprises causing the computer to perform operations of: displaying a main menu in a portion of the main screen display area; and displaying a sub menu aggregating the operation images in the portion of the main screen display area when the main menu is selected by operating a user.

In an embodiment, causing the computer to perform the operations comprises causing the computer to perform operations of: judging whether or not the vertical screen resolution is larger than the horizontal screen resolution when at least one of the operation images aggregated in the sub menu is selected by operating the user; displaying the selected operation image in the work area when the vertical screen resolution is larger than the horizontal screen resolution; and determining the display area as the main screen display area when the vertical screen resolution is smaller than the horizontal screen resolution to display the selected operation image as the main screen display area.

In an embodiment, causing the computer to perform the operations comprises changing a size and/or an arrangement position of the operation image in the work area according to the operation of the user.

In an embodiment, there is provided a semiconductor manufacturing apparatus comprising: a processing unit configured to perform a designated operation against a substrate; and a display control system comprising a controller configured to control the operation of the processing unit, wherein the controller comprises: a memory in which the above-described program is stored; a processing device configured to perform arithmetic operation according to the program stored in the memory; the above-described display device; and an input device configured to input information necessary for performing the program.

In an embodiment, the display control system comprises: a terminal device configured to control the operation of the processing unit separately from the controller; and a network configured to connect the processing unit, the controller, and the terminal device.

In an embodiment, the controller has an interlock function which does not allow any one of the controller and the terminal device to control the processing unit simultaneously.

In an embodiment, the controller and the terminal device each have a synchronization function configured to synchronize data shared by the controller and the terminal device through the network.

In an embodiment, the controller and the terminal device each have a backup function configured to automatically backup data shared by the controller and the terminal device through the network.

When the display screen is the vertical screen, the display area of the display screen is divided into the main screen display area and the work area. Therefore, the user can operate the operation image displayed in the work area while monitoring the monitoring image displayed in the main screen display area. Therefore, the user-friendliness with respect to the semiconductor manufacturing apparatus can be improved.

DESCRIPTION OF EMBODIMENTS

Figure 1:
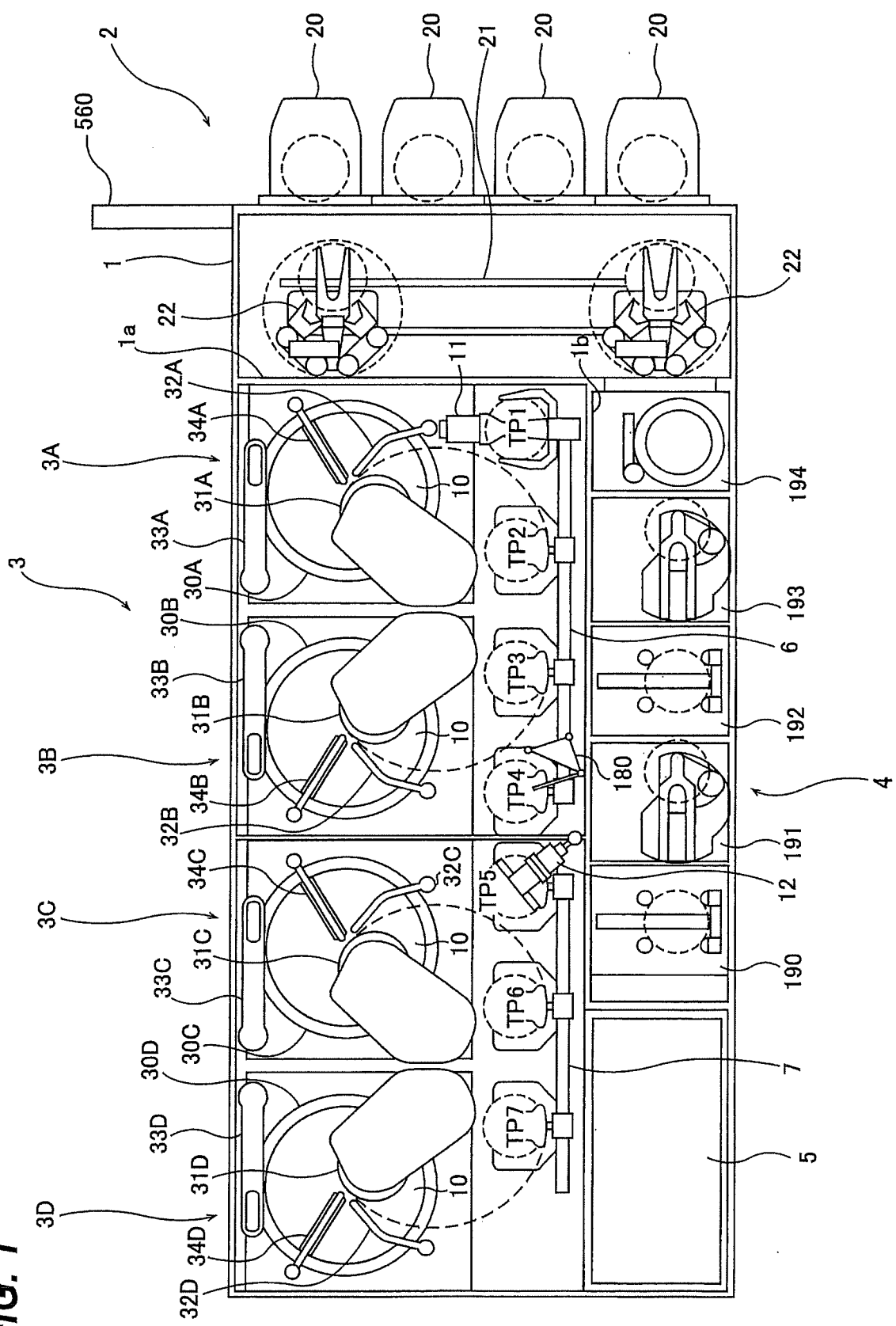
FIG. 1 is a plan view showing an embodiment of a semiconductor manufacturing apparatus.

Embodiments will be described below with reference to the drawings. Identical or corresponding structural elements are denoted by identical reference numerals and will not be described below repetitively.

FIG. 1 is a plan view showing an embodiment of a semiconductor manufacturing apparatus. As shown in FIG. 1, the semiconductor manufacturing apparatus includes a housing 1 in a generally-rectangular shape. An interior space of the housing 1 is divided into a loading/unloading unit 2, a polishing unit 3, and a cleaning unit 4 by partition walls 1a, 1b. The loading/unloading unit 2, the polishing unit 3, and the cleaning unit 4 are assembled independently of each other, and air is discharged independently of each other. The semiconductor manufacturing apparatus includes a controller 5 configured to control substrate processing operations.

The loading/unloading unit 2 includes two or more (four in this embodiment) front load sections 20 on which wafer cassettes, each storing plural wafers (substrate), are placed. These front load sections 20 are arranged adjacent to the housing 1 along a width direction of the semiconductor manufacturing apparatus (a direction perpendicular to a longitudinal direction). Each of the front loading sections 20 is capable of receiving thereon an open cassette, an SMIF (Standard Manufacturing Interface) pod, or a FOUP (Front Opening Unified Pod). The SMIF and FOUP are a hermetically sealed container which houses a wafer cassette therein and is covered with a partition to thereby provide interior environments isolated from an external space.

The loading/unloading unit 2 includes a moving mechanism 21 extending along an arrangement direction of the front load sections 20. Two transport robots (loaders or transport mechanism) 22 are installed on the moving mechanism 21 and are movable along the arrangement direction of the wafer cassettes. The transport robots 22 are configured to move on the moving mechanism 21 so as to access the wafer cassettes mounted on the front loading sections 20. Each transport robot 22 includes vertically arranged two hands, which are separately used. The upper hand can be used for returning a processed wafer to the wafer cassette, and the lower hand can be used for taking out a wafer to be processed from the wafer cassette. The lower hand of the transport robot 22 is configured to rotate about its own axis, so that it can reverse the wafer.

The load/unloading unit 2 is required to be a cleanest area. Therefore, a pressure in the interior of the loading/unloading unit 2 is kept higher at all times than pressures in the exterior space of the semiconductor manufacturing apparatus, the polishing unit 3, and the cleaning unit 4. On the other hand, the polishing unit 3 is the dirtiest area, because slurry is used as a polishing liquid. Therefore, negative pressure is developed in the polishing unit 3, and the pressure in the polishing unit 3 is kept lower than the internal pressure of the cleaning unit 4. A filter fan unit (not shown) having a clean air filter, such as a HEPA filter, an ULPA filter, or a chemical filter, is provided in the loading/unloading unit 2. The filter fan unit removes particles, toxic vapor, and toxic gas from air to form flow of clean air at all times.

The polishing unit 3 is an area where the wafer is polished (planarized). The polishing unit 3 includes a first polishing unit 3A, a second polishing unit 3B, a third polishing unit 3C, and a fourth polishing unit 3D. The first polishing unit 3A, the second polishing unit 3B, the third polishing unit 3C, and the fourth polishing unit 3D are arranged along the longitudinal direction of the semiconductor manufacturing apparatus.

As shown in FIG. 1, the first polishing unit 3A includes a polishing table 30A to which a polishing pad 10 having a polishing surface is attached, a top ring 31A for holding the wafer and pressing the wafer against the polishing pad 10 on the polishing table 30A to polish the wafer, a polishing liquid supply nozzle 32A for supplying a polishing liquid and a dressing liquid (e.g., pure water) onto the polishing pad 10, and an atomizer 34A for ejecting a mixture of a liquid (e.g., pure water) and a gas (e.g., nitrogen gas) or a liquid (e.g., pure water) in an atomized state onto the polishing surface.

Similarly, the second polishing unit 3B includes a polishing table 30B to which a polishing pad 10 is attached, a top ring 31B, a polishing liquid supply nozzle 32B, a dresser 33B, and an atomizer 34B. The third polishing unit 3C includes a polishing table 30C to which a polishing pad 10 is attached, a top ring 31C, a polishing liquid supply nozzle 32C, a dresser 33C, and an atomizer 34C. The fourth polishing unit 3D includes a polishing table 30D to which a polishing pad 10 is attached, a top ring 31D, a polishing liquid supply nozzle 32D, a dresser 33D, and an atomizer 34D.

The first polishing unit 3A, the second polishing unit 3B, the third polishing unit 3C, and the fourth polishing unit 3D have the same configuration. Therefore, the first polishing unit 3A will be described below.

Figure 2:
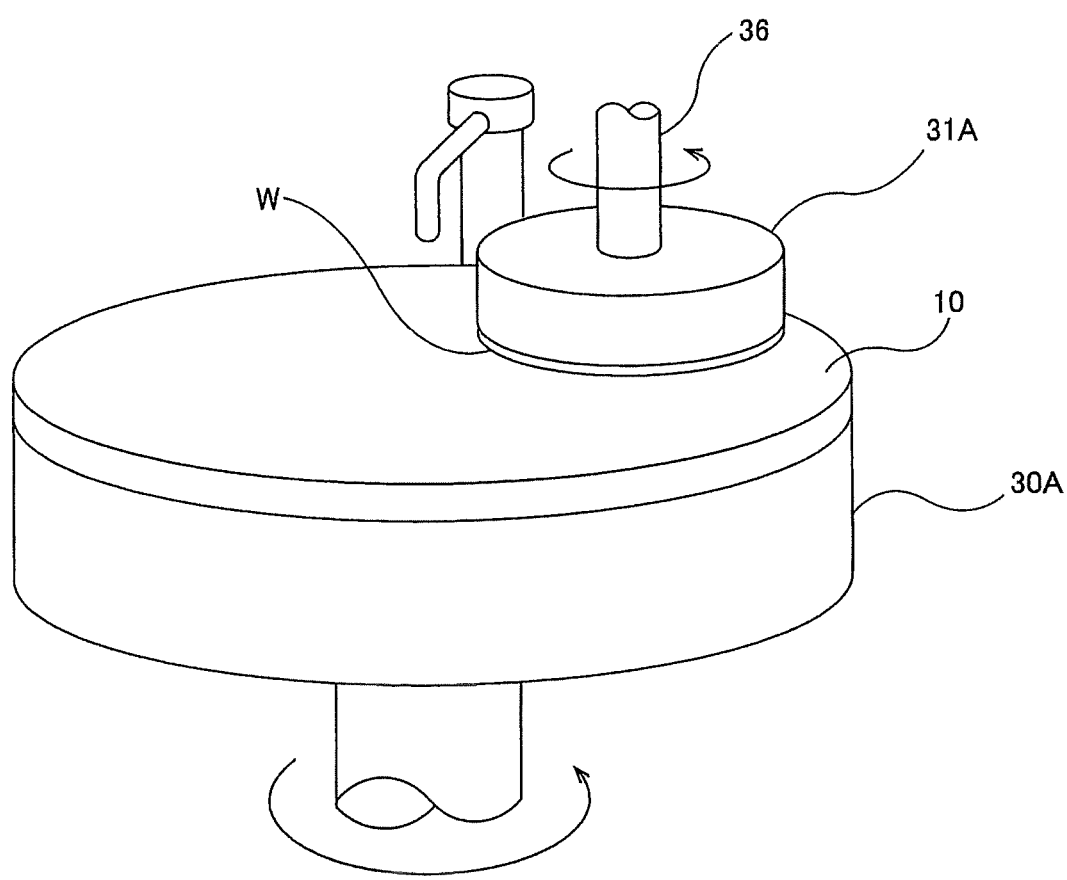
FIG. 2 is a perspective view schematically showing a first polishing unit.

FIG. 2 is a perspective view schematically showing the first polishing unit 3A. The top ring 31A is supported by a top ring shaft 36. The polishing pad 10 is attached to an upper surface of the polishing table 30A. An upper surface of the polishing pad 10 provides the polishing surface where a wafer W is polished. Instead of the polishing pad 10, a fixed abrasive may be used. The top ring 31A and the polishing table 30A are configured to rotate about their own axes, as indicated by arrows. The wafer W is held on a lower surface of the top ring 31A via vacuum suction. During polishing, the polishing liquid supply nozzle 32A supplies the polishing liquid onto the polishing surface of the polishing pad 10, and the top ring 31A presses the wafer W as an object to be polished against the polishing surface to thereby polish the wafer W.

The transport mechanism for transporting a wafer will be described. As shown in FIG. 1, a first linear transporter 6 is disposed adjacent to the first polishing unit 3A and the second polishing unit 3B. The first linear transporter 6 is a mechanism for transporting a wafer between four transport positions (i.e., a first transport position TP1, a second transport position TP2, a third transport position TP3, and a fourth transport position TP4 spaced successively from the loading/unloading unit), arrayed along the direction in which the polishing units 3A, 3B are arrayed.

A second linear transporter 7 is disposed adjacent to the third polishing unit 3C and the fourth polishing unit 3D. The second linear transporter 7 is a mechanism for transporting a wafer between three transport positions (i.e., a fifth transport position TP5, a sixth transport position TP6, and a seventh transport position TP7 spaced successively from the loading/unloading unit), arrayed along the direction in which the polishing units 3C, 3D are arrayed.

A wafer is transported to the polishing units 3A, 3B by the first linear transporter 6. The top ring 31A of the first polishing unit 3A is movable between a polishing position and the second transport position TP2 by a swing operation of a top ring head. Therefore, the transfer of the wafer to the top ring 31A is performed at the second transport position TP2. Similarly, the top ring 31B of the second polishing unit 3B is movable between a polishing position and the third transport position TP3, and the transfer of the wafer to the top ring 31B is performed at the third transport position TP3. The top ring 31C of the third polishing unit 3C is movable a polishing position and the sixth transport position TP6, and the transfer of the wafer to the top ring 31C is performed at the sixth transport position. TP6. The top ring 31D of the fourth polishing unit 3D is movable between a polishing position and the seventh transport position TP7, and the transfer of the wafer to the top ring 31D is performed at the seventh transport position TP7.

A lifter 11 for receiving the wafer from the transport robot 22 is disposed in the first transport position TP1. The wafer is transferred from the transport robot 22 to the first linear transporter 6 by the lifter 11. The partition 1a has a shutter (not shown) positioned therein between the lifter 11 and the transport robot 22. When the wafer is to be transferred, the shutter is opened to allow the transport robot 22 to transfer the wafer to the lifer 11. A swing transporter 12 is disposed between the first linear transporter 6, the second linear transporter 7, and the cleaning unit 4. The swing transporter 12 has a hand movable between the fourth transport position TP4 and the fifth transport position TP5. The transfer of the wafer from the first linear transporter 6 to the second linear transporter 7 is performed by the swing transporter 12. The wafer is transported to the third polishing unit 3C and/or the fourth polishing unit 3D by the second linear transporter 7. Further, the wafer that has been polished in the polishing unit 3 is transported to the cleaning unit 4 by the swing transporter 12.

Figure 3A:
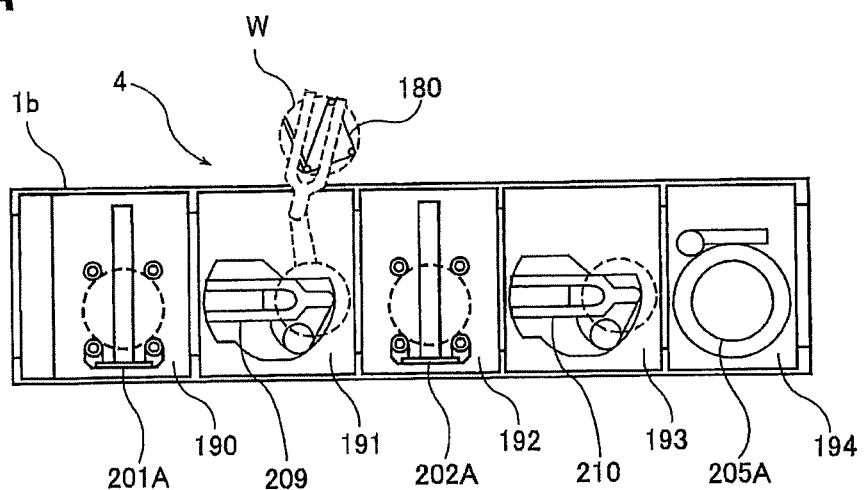
FIG. 3A is a plan view showing a cleaning unit.
Figure 3B:
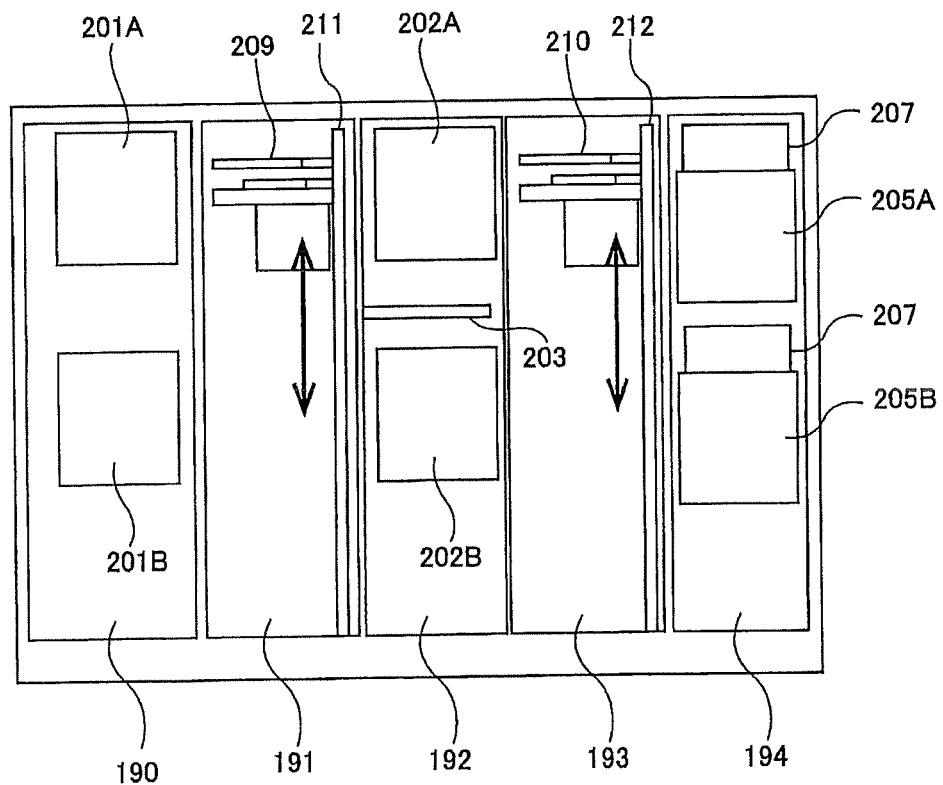
FIG. 3B is a side view showing a cleaning unit.

FIG. 3A is a plan view showing the cleaning unit 4. FIG. 3B is a side view showing the cleaning unit 4. As shown in FIG. 3A and FIG. 3B, the cleaning unit 4 includes a first cleaning chamber 190, a first transfer chamber 191, a second cleaning chamber 192, a second transfer chamber 193, and a drying chamber 194. In the first cleaning chamber 190, an upper primary cleaning module 201A and a lower primary cleaning module 201B are disposed. These primary cleaning modules 201A and 201B are aligned along a vertical direction. Specifically, the upper primary cleaning module 201A is arranged above the lower primary cleaning module 201B. Similarly, an upper secondary cleaning module 202A and a lower secondary cleaning module 202B are disposed in the second cleaning chamber 192, and are aligned along the vertical direction. The upper secondary cleaning module 202A is arranged above the lower secondary cleaning module 202B. The first and secondary cleaning modules 201A, 201B, 202A, and 202B are a cleaning machine for cleaning the wafer using a cleaning liquid. The arrangement of these cleaning modules 201A, 201B, 202A, and 202B along the vertical direction presents an advantage of reducing a footprint.

A temporary base 203 for the wafer is provided between the upper secondary cleaning module 202A and the lower secondary cleaning module 202B. In the drying chamber 194, an upper drying module 205A and a lower drying module 205B are disposed along the vertical direction. The upper drying module 205A and the lower drying module 205B are isolated from each other. Filter fan units 207 and 207 are provided on upper portions of the upper drying module 205A and the lower drying module 205B so as to supply a clean air to these drying modules 205A and 205B, respectively. The upper primary cleaning module 201A, the lower primary cleaning module 201B, the upper secondary cleaning module 202A, the lower secondary cleaning module 202B, the temporary base 203, the upper drying module 205A, and the lower drying module 205B are mounted on non-illustrated frames via bolts or the like.

A vertically-movable first transfer robot (transport mechanism) 209 is provided in the first transfer chamber 191, and a vertically-movable second transfer robot 210 is provided in the second transfer chamber 193. The first transfer robot 209 and the second transfer robot 210 are movably supported by vertically-extending support shafts 211 and 212. The first transfer robot 209 and the second transfer robot 210 have drive mechanisms (e.g., motors) therein, respectively, so that the transfer robots 209 and 210 can move along the support shafts 211 and 212 in the vertical directions. The first transfer robot 209 has vertically arranged two hands: an upper hand and a lower hand, as with the transfer robot 22. The first transfer robot 209 is located such that the lower hand thereof can access the above-described temporary base 180, as indicated by a dotted line in FIG. 3A. When the lower hand of the first transfer robot 209 accesses the temporary base 180, a shutter (not shown) on the partition 1b is opened.

The first transfer robot 209 is configured to transfer the wafer W between the temporary base 180, the upper primary cleaning module 201A, the lower primary cleaning module 201B, the temporary base 203, the upper secondary cleaning module 202A, and the lower secondary cleaning module 202B. When transferring a wafer to be cleaned (i.e., a wafer with slurry attached), the first transfer robot 209 uses its lower hand. On the other hand, when transferring a cleaned wafer, the first transfer robot 209 uses its upper hand. The second transfer robot 210 is configured to transfer the wafer W between the upper secondary cleaning module 202A, the lower secondary cleaning module 202B, the temporary base 203, the upper drying module 205A, and the lower drying module 205B. The second transfer robot 210 transfers only a cleaned wafer, and thus has a single hand. The transfer robot 22 shown in FIG. 1 uses its upper hand to remove the wafer from the upper drying module 205A or the lower drying module 205B, and returns the wafer to the wafer cassette. When the upper hand of the transfer robot 22 accesses the drying modules 205A, 205B, a shutter (not shown) on the partition 1a is opened.

As described above, the semiconductor manufacturing apparatus includes the loading/unloading unit 2, the polishing unit 3, and the cleaning unit 4. Hereinafter, these units 2 to 4 may be referred to as processing units, respectively. These processing units are units configured to perform designated operations against the wafer, respectively. The designated operations include the operation of polishing a wafer, the operation of cleaning a wafer, and the operation of transporting a wafer.

Figure 4:
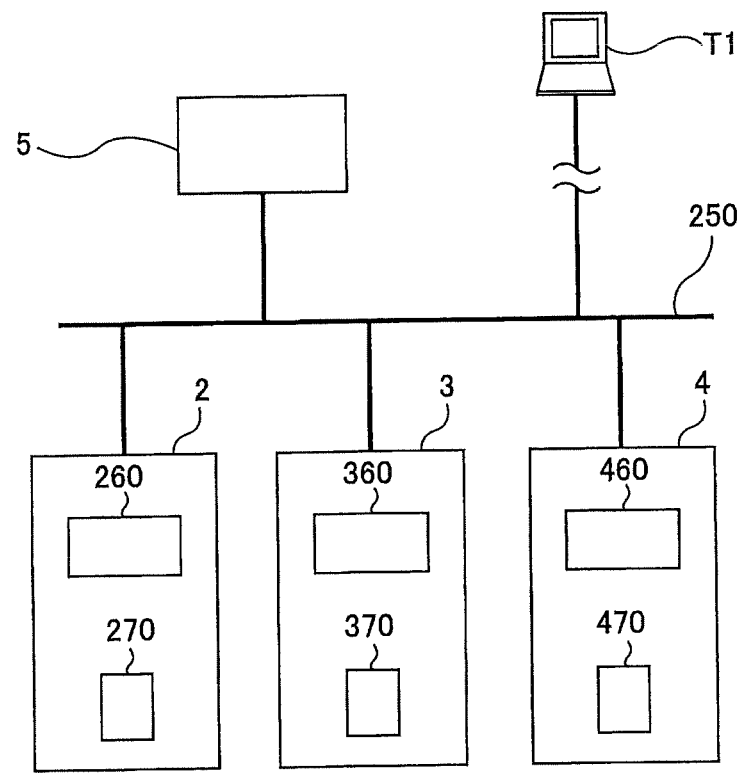
FIG. 4 is a schematic view showing a configuration of the semiconductor manufacturing apparatus.

FIG. 4 is a schematic view showing a configuration of the semiconductor manufacturing apparatus. A network 250 is built in the semiconductor manufacturing apparatus. The controller 5 is connected to the loading/unloading unit 2, the polishing unit 3, and the cleaning unit 4 through the network 250. Each component of each processing unit operates by a command from the controller 5. More specifically, the controller 5 controls the operation of the processing unit.

A sequencer 260 for controlling the operations of the components such as the transfer robot 22 and the like in the loading/unloading unit 2 is provided in the loading/unloading unit 2. A sensor 270 for detecting data on the control of the loading/unloading unit 2 is provided in the loading/unloading unit 2. For example, the sensor 270 includes a sensor configured to detect whether or not a wafer is installed in the transfer robot 22.

A sequencer 360 for controlling the operations of the components such as the polishing table, the top ring, and the like, in the polishing unit 3 is provided in the polishing unit 3. A sensor 370 for detecting data on the control of the polishing unit 3 is provided in the polishing unit 3. The sensor 370 includes a sensor configured to detect a flow rate of the polishing liquid supplied onto the polishing pad 10, a sensor configured to detect a rotational speed of the polishing table 30, a sensor configured to detect a rotary torque of the polishing table 30 or the top ring 31, and the like.

A sequencer 460 for controlling the operations of the components such as the cleaning module, the transfer robot, and the like, in the cleaning unit 4 is provided in the cleaning unit 4. A sensor 470 configured to detect data on the control of the cleaning unit 4 is provided in the cleaning unit 4. The sensor 470 includes a sensor configured to detect a flow rate of the cleaning liquid supplied onto the wafer, and the like.

Figure 5:
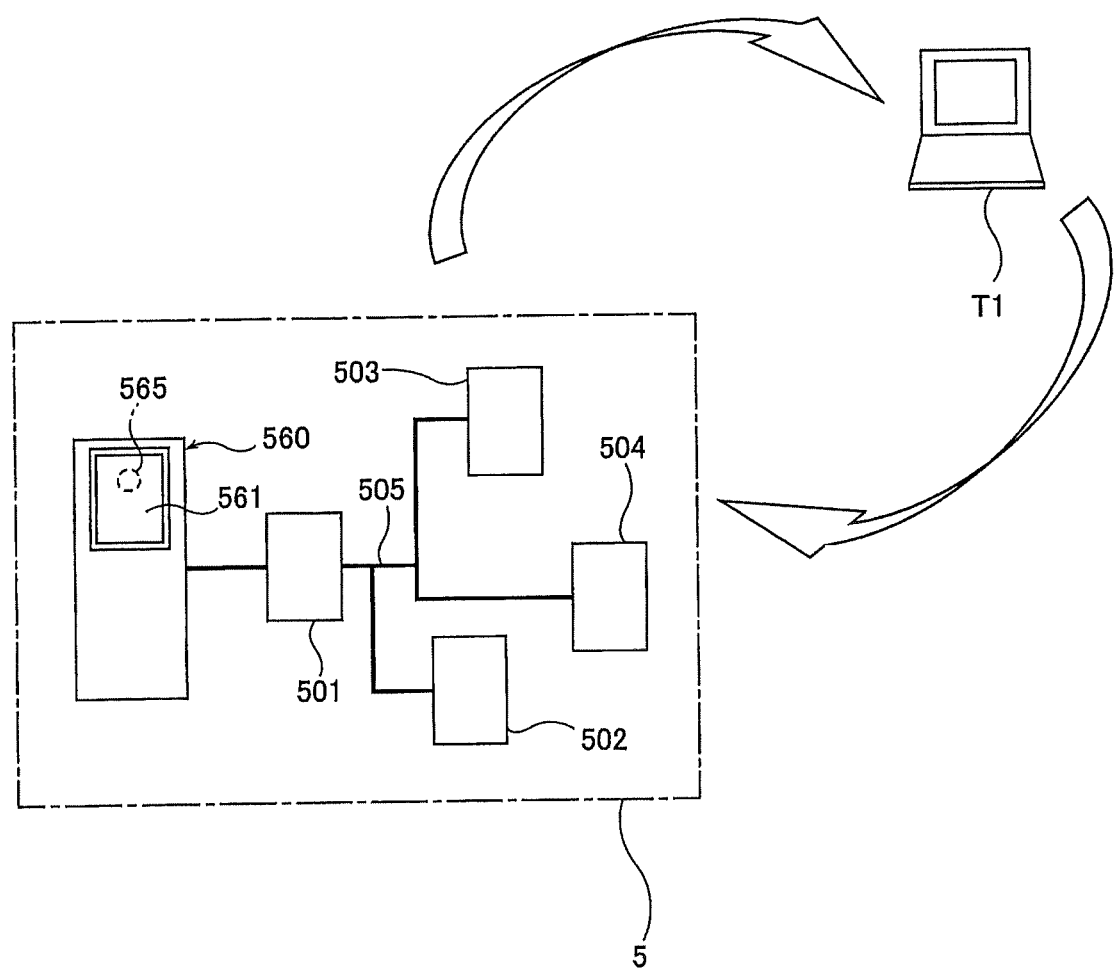
FIG. 5 is a schematic view showing a display control system.

A display control system provided in the semiconductor manufacturing apparatus will be described. FIG. 5 is a schematic view showing a display control system. As shown in FIG. 5, the display control system includes the controller 5, and a terminal device T1 configured to control the operation of the processing unit separately from the controller 5. The terminal device T1 is a PC (personal computer) disposed outside the semiconductor manufacturing apparatus. In this embodiment, one terminal device T1 is illustrated, but the number of terminal devices is not limited to this embodiment.

The controller 5 includes a first computer 501 configured to store and manage information (program, data, etc.) on an apparatus operation status of the semiconductor manufacturing apparatus, and a second computer 502 configured to store and manage information (program, data, etc.) on a recipe of the semiconductor manufacturing apparatus. The recipe is a series of processing programs including a processing condition such as a temperature, a pressure, a liquid, a gas flow rate, time, a pressing condition, and/or a control target value of the rotational speed in the semiconductor manufacturing apparatus.

The controller 5 further includes a third computer 503 configured to store and manage information (program, data, etc.) on a process of the semiconductor manufacturing apparatus, fourth computer 504 configured to store and manage software information (program, data, etc.) on a process of the semiconductor manufacturing apparatus, and a display device 560 configured to display an image with respect to the operation of the processing unit. Details of the display device 560 will be described later.

The controller 5 includes four computers 501 to 504, but the number of computers is not limited to this embodiment. The controller 5 may include at least two computers (including the first computer 501). A network 505 is built in the controller 5. The display device 560 and the computers 501 to 504 are connected through the network 505. The network 505 may be shared with the above-described network 250 (see FIG. 4).

The terminal device T1 is connected to the network 250 built in the semiconductor manufacturing apparatus. In one embodiment, the terminal device T1 may be connected to the network 250 through a connection port (connection terminal) to which a communication cable is to be connected. In another embodiment, the terminal device T1 may be connected to the network 250 through a wireless LAN access point (which is also referred to as a wireless LAN station). The terminal device T1 can be freely connected to and disconnected from the network 250.

The controller 5 (more specifically, the computers 501 to 504) and the terminal device T1 each may have a synchronization function for synchronizing information (data) shared by the controller 5 and the terminal device T1 through the network 250. The synchronization means a state in which the controller 5 and the terminal device T1 each hold the same shared data without excess or deficiency. The shared data are shared between the controller 5 and the terminal device T1.

The controller 5 (more specifically, the computers 501 to 504) and the terminal device T1 each have a backup function for automatically backing up information (data) shared by the controller 5 and the terminal device T1 through the network 250.

Figure 6:
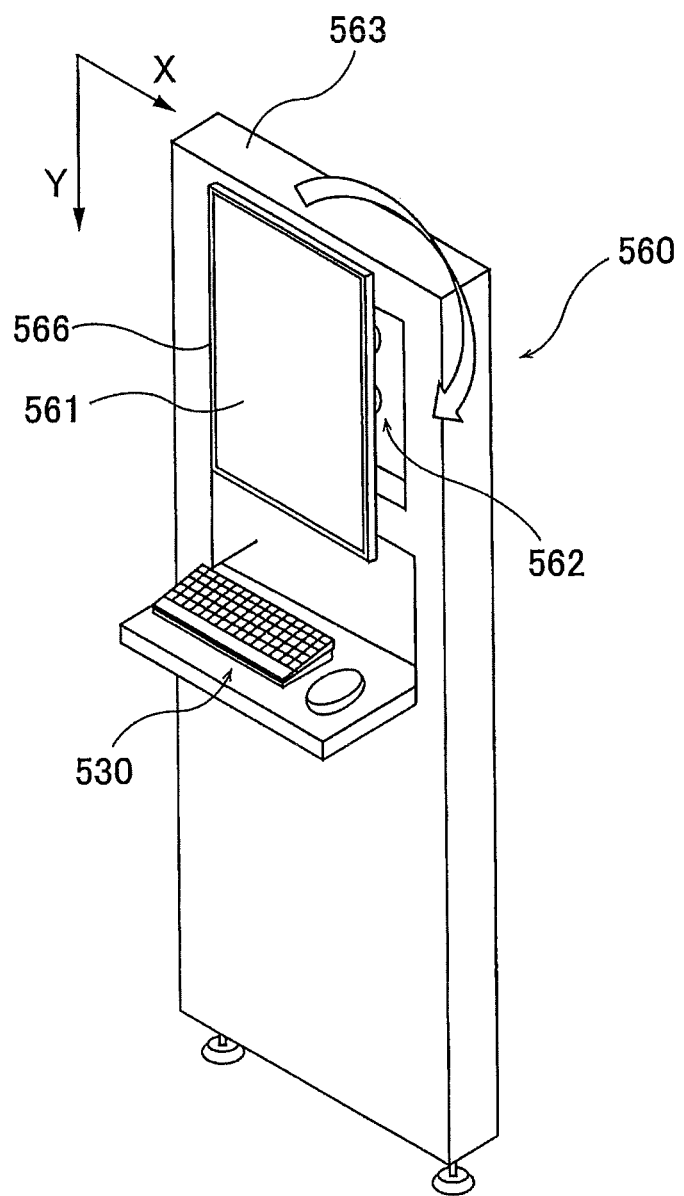
FIG. 6 is a perspective view showing a display device.

A configuration of the display device 560 will be described with reference to FIG. 6. FIG. 6 is a perspective view showing the display device 560. As shown in FIG. 6, the display device 560 includes a rectangular screen-display portion 566 having different a vertical length and a horizontal length, a support portion 562 rotatably supporting the screen-display portion 566, and a main body 563 to which the support portion 562 is attached. The screen-display portion 566 has a rectangular display screen 561 configured to display an image with respect to the processing unit. More specifically, the display screen 561 has a shape in which a vertical length of the display screen 561 and a horizontal length of the display screen 561 are different.

The display device 560 displays the image with respect to the processing unit on both screens of a vertical screen where the display screen 561 becomes a portrait orientation and a horizontal screen where the display screen 561 becomes a landscape orientation. In FIG. 6, the display screen 561 is the vertical screen.

When a screen resolution (the number of pixels) of a vertical direction (height direction) of the display screen 561 is smaller than a screen resolution (the number of pixels) of a horizontal direction (width direction) of the display screen 561, the display screen 561 is the horizontal screen. In other words, when the vertical length of the display screen 561 is smaller than the horizontal length of the display screen 561, the display screen 561 is the horizontal screen.

When the screen resolution (the number of pixels) of the vertical direction (height direction) of the display screen 561 is larger than the screen resolution (the number of pixels) of the horizontal direction (width direction) of the display screen 561, the display screen 561 is the vertical screen. In other words, when the vertical length of the display screen 561 is larger than the horizontal length of the display screen 561, the display screen 561 is the vertical screen. The horizontal direction (width direction) of the display screen 561 is defined as a direction parallel to an X axis direction (horizontal direction) in FIG. 6. The vertical direction (height direction) of the display screen 561 is defined as a direction parallel to a Y axis direction (vertical direction) in FIG. 6.

Figure 7:
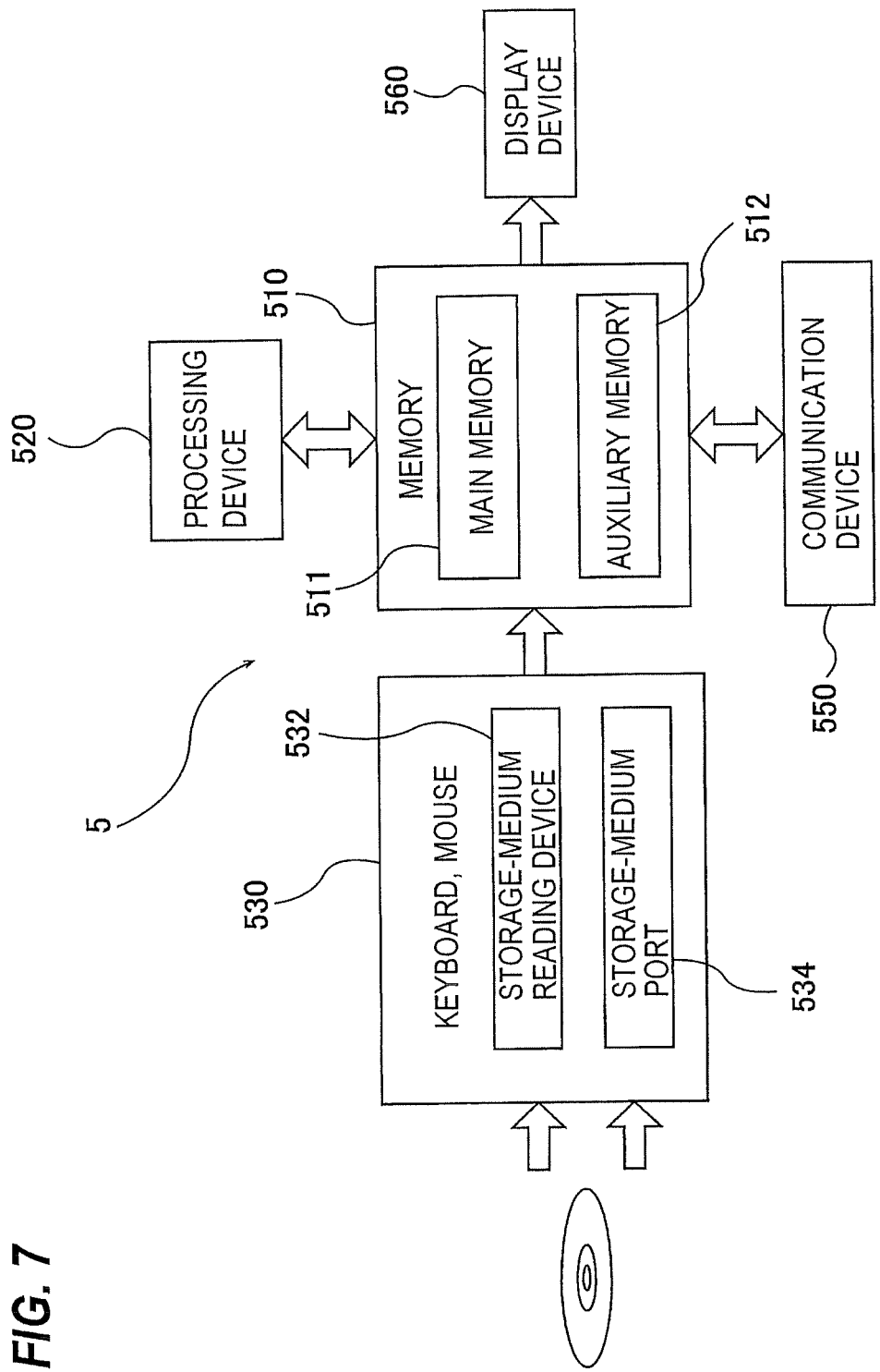
FIG. 7 is a schematic view showing a configuration of a controller operating according to a screen control program.

The controller 5 operates according to a screen control program configured to cause the controller 5 to perform a screen display method applied to the display device 560. FIG. 7 is a schematic view showing a configuration of the controller 5 operating according to the screen control program. The controller 5 includes a memory 510 in which a program including at least the screen control program and data are stored, a processing device 520, such as CPU (central processing unit), for performing arithmetic operation according to the program stored in the memory 510, an input device 530 for inputting the data, the program, and various information in the memory 510, the above-described display device 560, and a communication device 550 for connecting to the network 250 (and/or the network 505).

The memory 510 in which the program including at least the screen control program is stored may be provided in any one of the computers 501 to 504 or in a different computer (not shown) from the computers 501 to 504.

The memory 510 includes a main memory 511 which is accessible by the processing device 520, and an auxiliary memory 512 that stores the data and the program therein. The main memory 511 may be a random-access memory (RAM), and the auxiliary memory 512 is a storage device which may be a hard disk drive (HDD) or a solid-state drive (SSD).

The input device 530 includes a keyboard and a mouse, and further includes a storage-medium reading device 532 for reading the data from a storage medium, and a storage-medium port 534 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 532 include optical disk drive (e.g., CD drive, DVD drive) and card reader. Examples of the storage-medium port 534 include USB terminal. The program and/or the data stored in the storage medium is introduced into the controller 5 through the input device 530, and is stored in the auxiliary memory 512 of the memory 510. The input device 530 is a device for inputting information necessary for performing the program.

Figure 8:
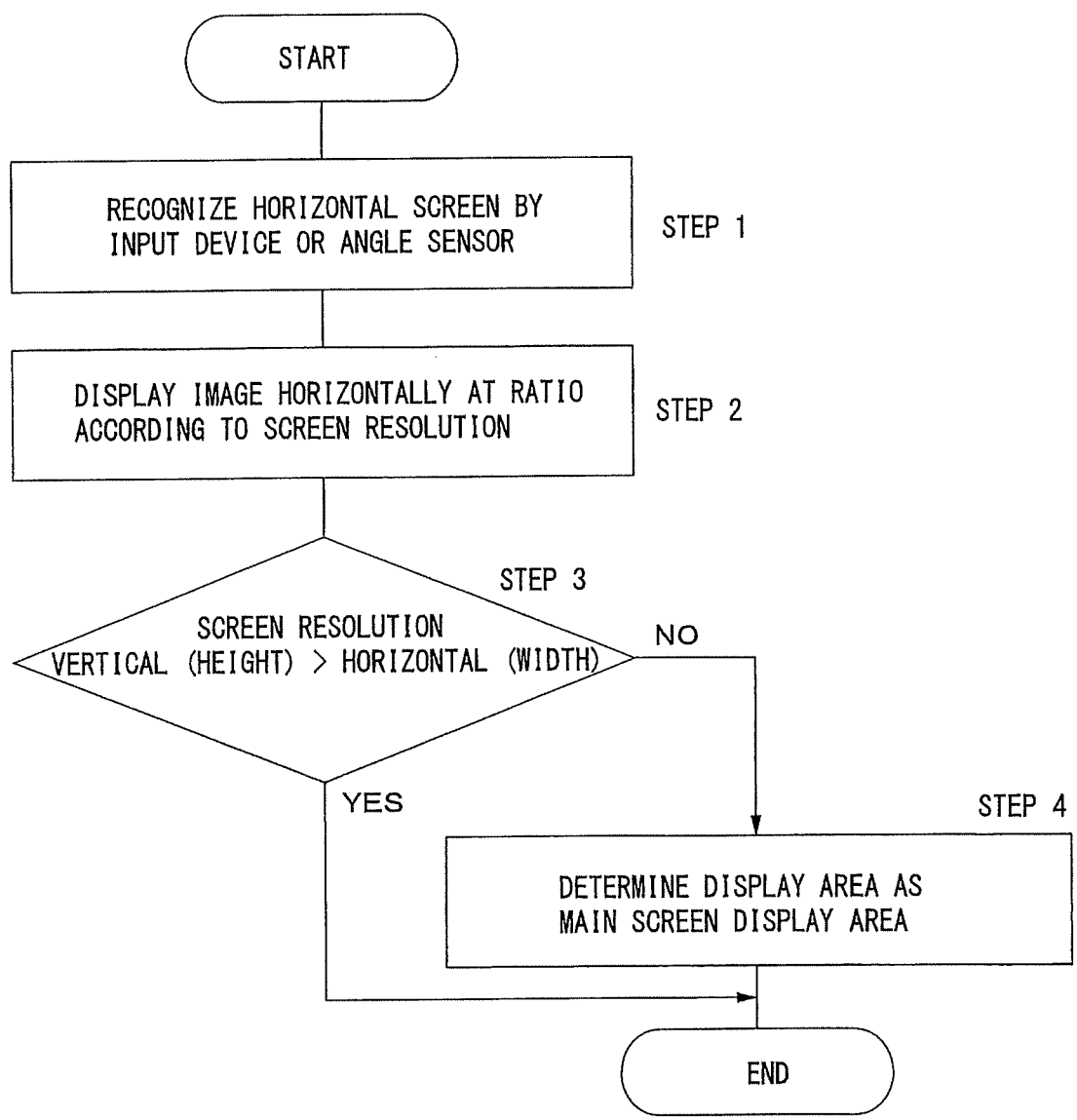
FIG. 8 is a view showing a process flow of the controller operating according to the screen control program.
Figure 9:
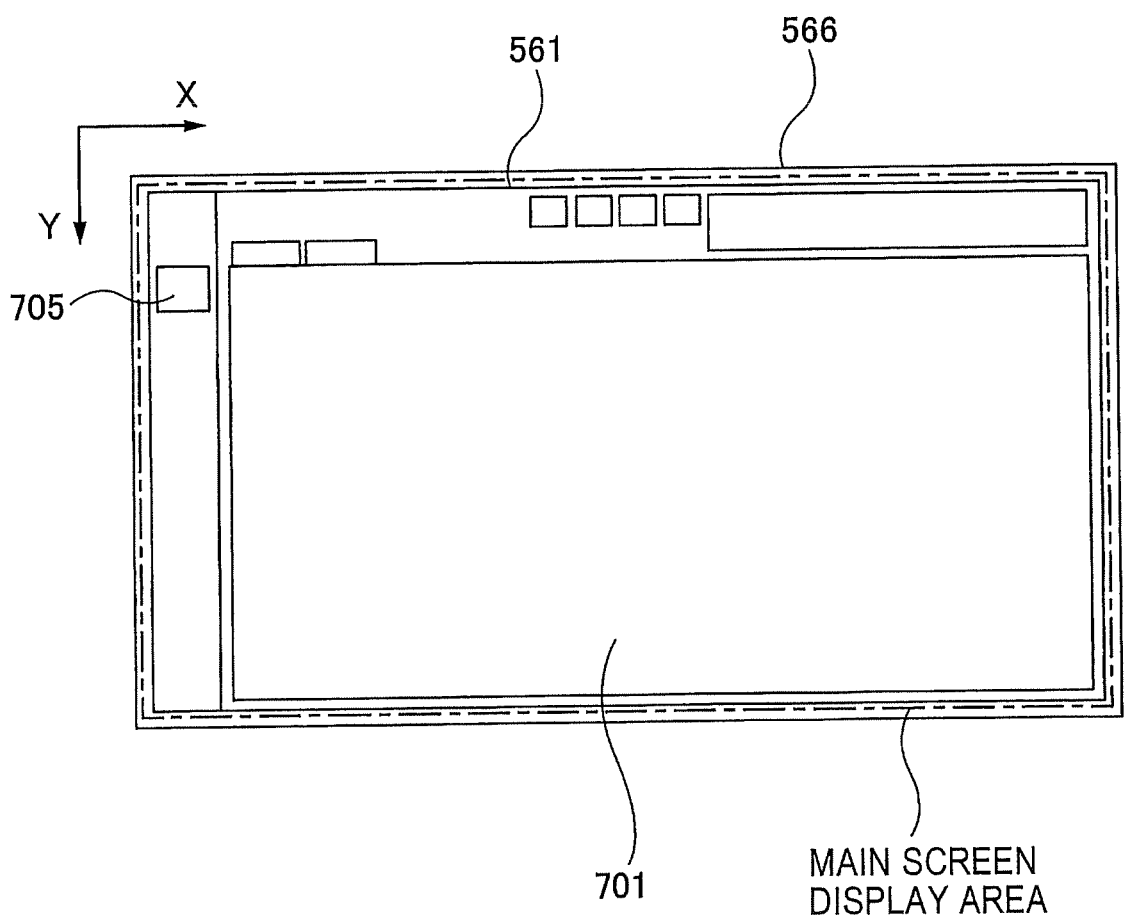
FIG. 9 is a view showing a display screen which is a horizontal screen.

FIG. 8 is a view showing a process flow of the controller 5 operating according to the screen control program. FIG. 9 is a view showing the display screen 561 which is the horizontal screen. First, a user causes the controller 5 to recognize that the display screen 561 is the horizontal screen by operating the input device 530 (i.e., the keyboard or the mouse) (see step 1 in FIG. 8).

In one embodiment, the display device 560 may include an angle sensor 565 (see FIG. 5) configured to detect switching of an arrangement of the screen display portion 566 (i.e., display screen 561). In this case, the controller 5 may recognize switching of the display screen 561 from the horizontal screen to the vertical screen and switching of the display screen 561 from the vertical screen to the horizontal screen based on a detection signal sent from the angle sensor 565.

The controller 5 displays the image horizontally at a ratio according to the screen resolution of the display screen 561 (see step 2 in FIG. 8), and judges whether or not the vertical screen resolution (the number of pixels) of the display screen 561 is larger than the horizontal screen resolution (the number of pixels) of the display screen 561 (see step 3 in FIG. 8).

When the vertical screen resolution of the display screen 561 is smaller than the horizontal screen resolution of the display screen 561 (see "NO" of step 3 in FIG. 8), i.e., the display screen 561 is the horizontal screen, the controller 5 determines this to determine the entire display area of the display screen 561 as a main screen display area (see step 4 in FIG. 8).

When the vertical screen resolution of the display screen 561 is larger than the horizontal screen resolution of the display screen 561 (see "YES" of step 3 in FIG. 8), the controller 5 determines this to terminate the processing of the controller 5.

The program for causing the controller 5 to perform these steps is stored in a non-transitory tangible computer-readable storage medium. The controller 5 is provided with the program through the storage medium. The controller 5 may be provided with the program through communication network, such as the Internet.

After the step 4 in FIG. 8, the controller 5 displays a monitoring image 701 displaying an operational status (i.e., progress status) of the processing unit in the entire main screen display area. The controller 5 displays the progress of the wafer as an object of processing (processing wafer) as the monitoring image 701 in the main screen display area from information (data) on the operational status of the processing unit stored and managed by the first computer 501.

In one embodiment, a structure of the processing unit constituting the semiconductor manufacturing apparatus may be schematically displayed as the monitoring image 701 so that the user can monitor the progress of the processing wafer. When the display screen 561 is the horizontal screen, the monitoring image 701 is displayed largely in the entire display area of the display screen 561 so that the user can easily monitor the progress of the processing wafer.

Figure 10:
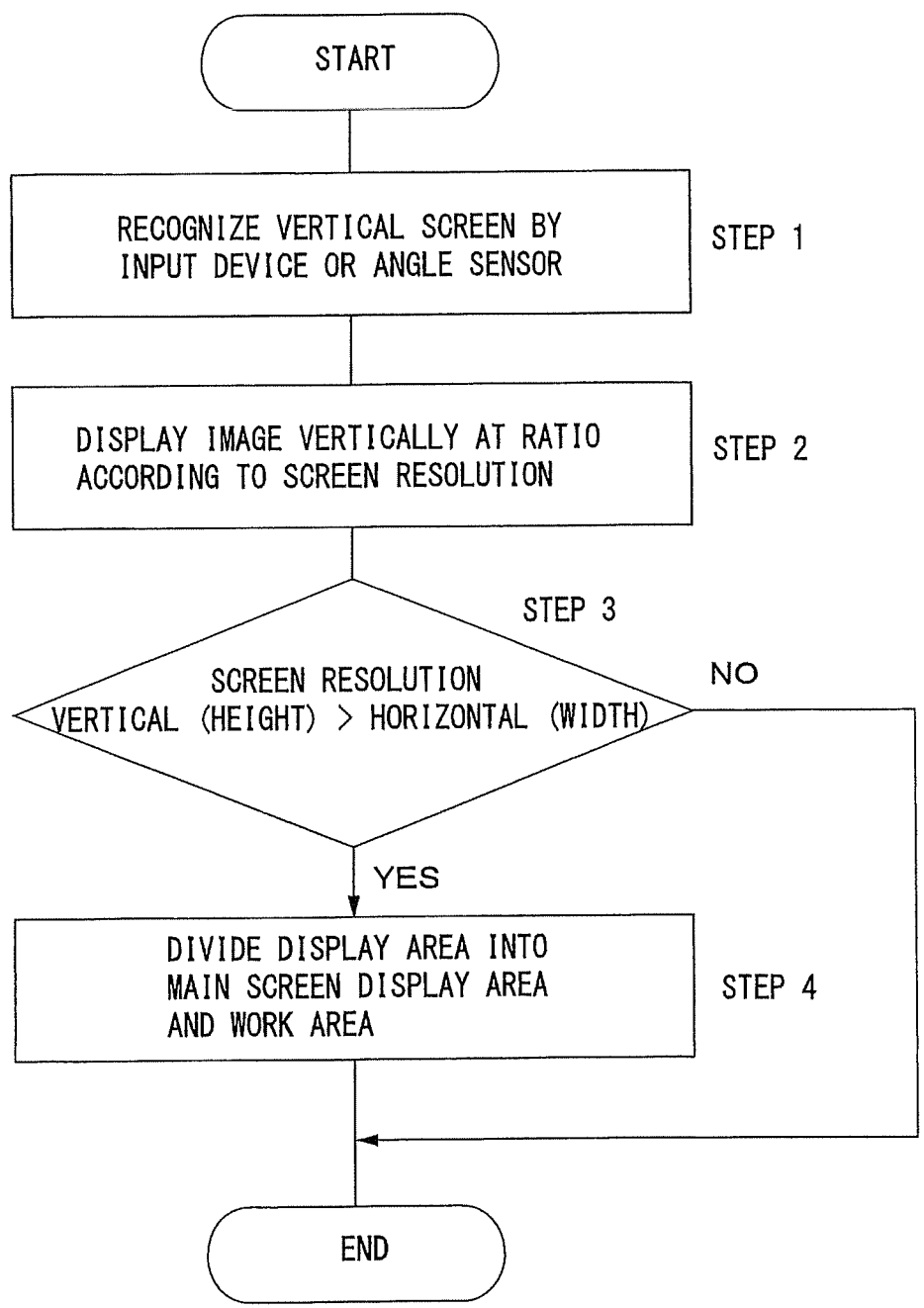
FIG. 10 is a view showing a process flow of the controller when switching a screen resolution of the display screen.
Figure 11:
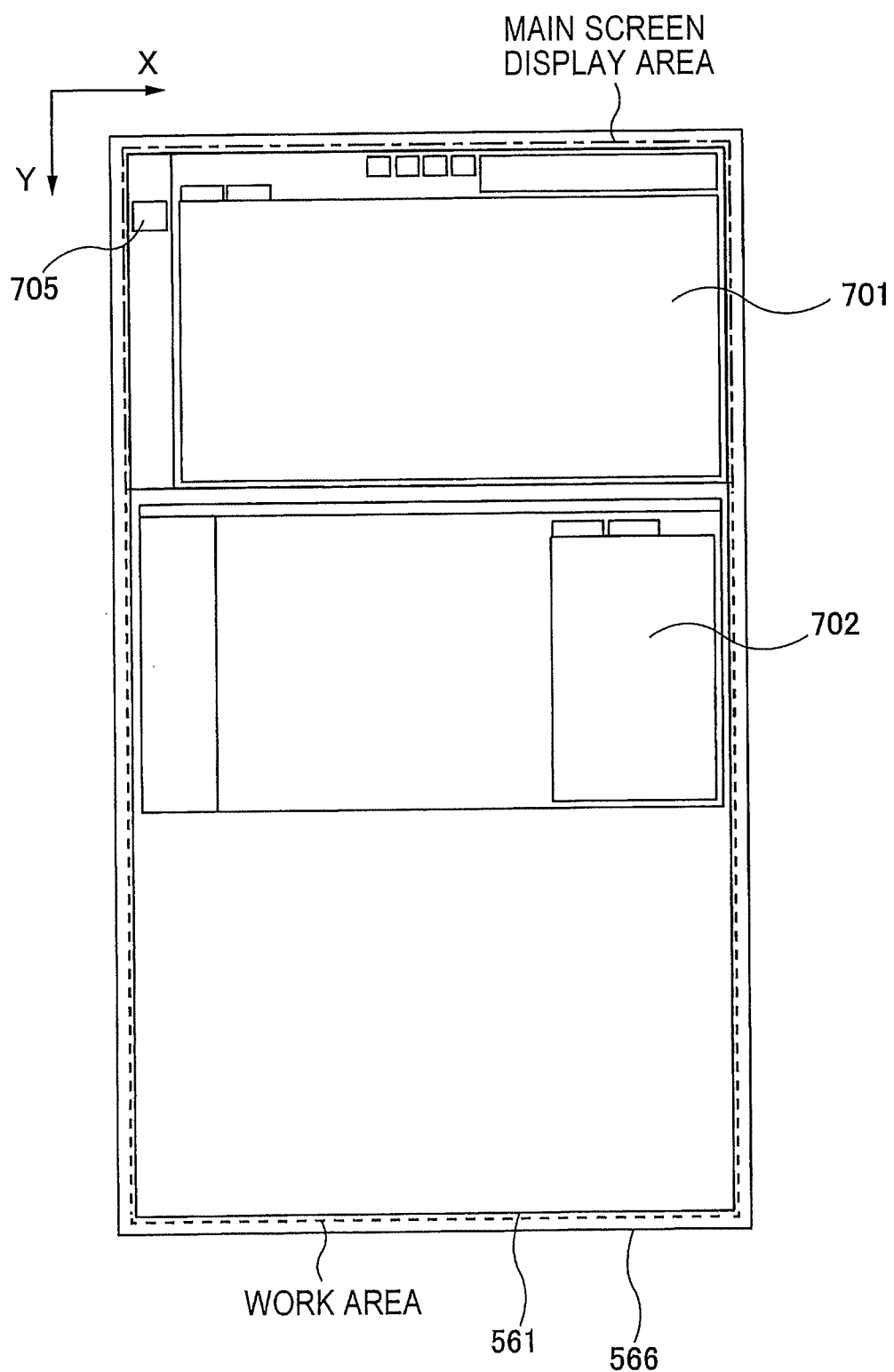
FIG. 11 is a view showing the display screen which is a vertical screen.

FIG. 10 is a view showing a process flow of the controller 5 when switching the screen resolution of the display screen 561. FIG. 11 is a view showing the display screen 561 which is the vertical screen. First, the user rotates the display screen 561 (i.e., screen display portion 566) which is the horizontal screen to set the display screen 561 to the vertical screen. The user causes the controller 5 to recognize that the display screen 561 is the vertical screen by operation the input device 530 (i.e., the keyboard or the mouse) (see step 1 in FIG. 10). In one embodiment, the controller 5 may recognize the switching of the display screen 561 from the horizontal screen to the vertical screen based on the detection signal sent from the angle sensor 565.

The controller 5 displays the image vertically at a ratio according to the screen resolution of the display screen 561 (see step 2 in FIG. 10), and judges whether or not the vertical screen resolution (the number of pixels) of the display screen 561 is larger than the horizontal screen resolution (the number of pixels) of the display screen 561 (see step 3 in FIG. 10).

When the vertical screen resolution of the display screen 561 is larger than the horizontal screen resolution of the display screen 561 (see "YES" of step 3 in FIG. 10), the controller 5 determines this, and divides the display area of the display screen 561 into the main screen display area for displaying the monitoring image 701 with respect to the operational status of the processing unit and a work area for displaying an operation image 702 with respect to the operation of the processing unit (see step 4 in FIG. 10).

When the vertical screen resolution of the display screen 561 is smaller than the horizontal screen resolution of the display screen 561 (see "NO" of step 3 in FIG. 10), the controller 5 determines this to terminate the processing of the controller 5.

A size of the main screen display area is smaller than a size of the work area. In FIG. 11, the main screen display area is an area surrounded by a chain line, and the work area is an area surrounded by a dotted line. As shown in FIG. 11, the size of the main screen display area is ⅓ of the entire display area of the display screen 561, and the size of the work area is ⅔ of the entire display area of the display screen 561. The main screen display area and the work area are arranged in series along the vertical direction (height direction) of the display screen 561.

The controller 5 displays the monitoring image 701 in the main screen display area of the display screen 561 while maintaining an aspect ratio of the monitoring image 701. More specifically, in a state where the aspect ratio of the monitoring image 701 (see FIG. 9) displayed in the main screen display area is maintained when the display screen 561 is the horizontal screen, the controller 5 automatically regulates (change) the size of the monitoring image 701, and displays the monitoring image 701 in the main screen display area when the display screen 561 is the vertical screen.

In this embodiment, the monitoring image 701 displayed in the main screen display area when the display screen 561 is the horizontal screen is automatically reduced in a state where the aspect ratio of the monitoring image 701 is maintained, and is displayed in the entire main screen display area when the display screen 561 is the vertical screen.

The controller 5 displays the operation image 702 with respect to the operation of the processing unit in the work area. The work area is an area in which the user can display an arbitrary operation image 702. The work area is the entire area except the main screen display area in the display area of the display screen 561. The controller 5 can display at least one of information in the work area as the operation image 702 from information (data) stored and managed by the computers 502 to 504 according to the operation of the user. Information displayed by the operation image 702 can be freely determined depending on management matters as an object of a management of the semiconductor manufacturing apparatus and the user (person in charge).

The controller 5 can change a size and/or an arrangement position of the operation image 702 in the work area according to the operation by the user. Therefore, the user can freely change the size and/or the arrangement position of the operation image 702 through the input device 530. Further, the operation image 702 may be a plurality of images. The controller 5 can display a plurality of operation images 702 in the work area according to the operation by the user. In this case, the operation images 702 may be displayed so as to overlap on the work area.

In one embodiment, the operation image 702 includes at least an image displaying a process result of the processing unit, an image displaying a recipe determining processing conditions of the processing unit, an image displaying a waveform of an end timing (end point) of a wafer processing, an image displaying a circuit, and an image displaying the rotary torque of the polishing table 30 or the top ring 31.

The user can freely change the size and/or the arrangement position of each of the operation images 702 arranged in the work area. Therefore, for example, in order to compare an image of a current waveform at the end timing of the wafer processing and an image of a previous waveform, the user can display these images side-by-side.

Figure 12:
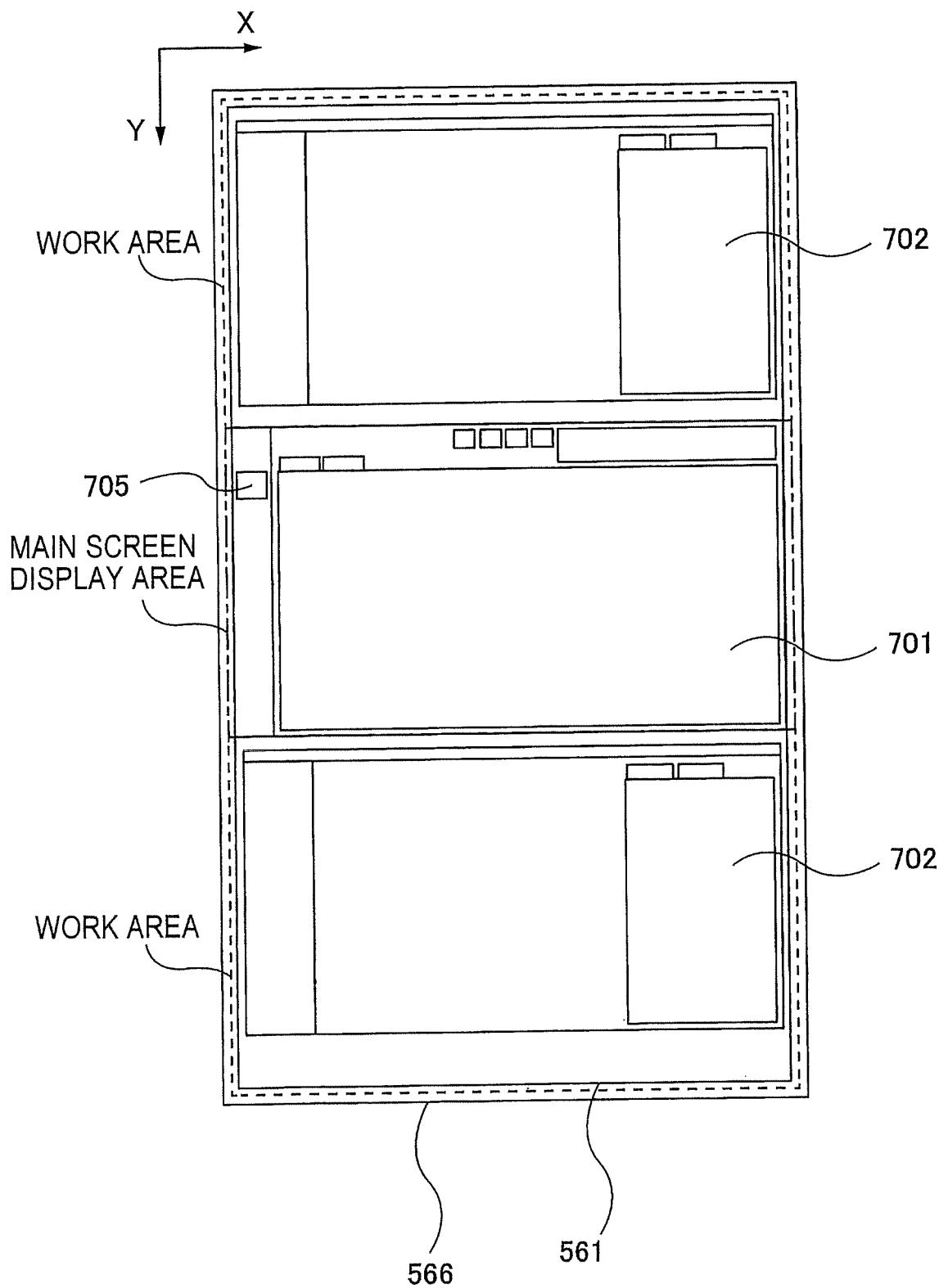
FIG. 12 is a view showing a main screen display area arranged in a central portion of a display area of the display screen.

In FIG. 11, the main screen display area is arranged in an upper portion of the display area of the display screen 561, and the work area is arranged in a central portion and a lower portion of the display area of the display screen 561. The work area arranged in the central portion and the lower portion of the display area is one area. As shown in FIG. 12, the controller 5 may arrange the main screen display area in the central portion of the display area of the display screen 561 according to the operation (for example, dragging and dropping the mouse) of the input device 530 by the user. In FIG. 12, the work area is two areas arranged in the upper portion and the lower portion of the display area of the display screen 561. In FIG. 12, two operation images 702 are displayed in the work area in the upper portion of the display area and the work area in the lower portion of the display area.

Figure 13:
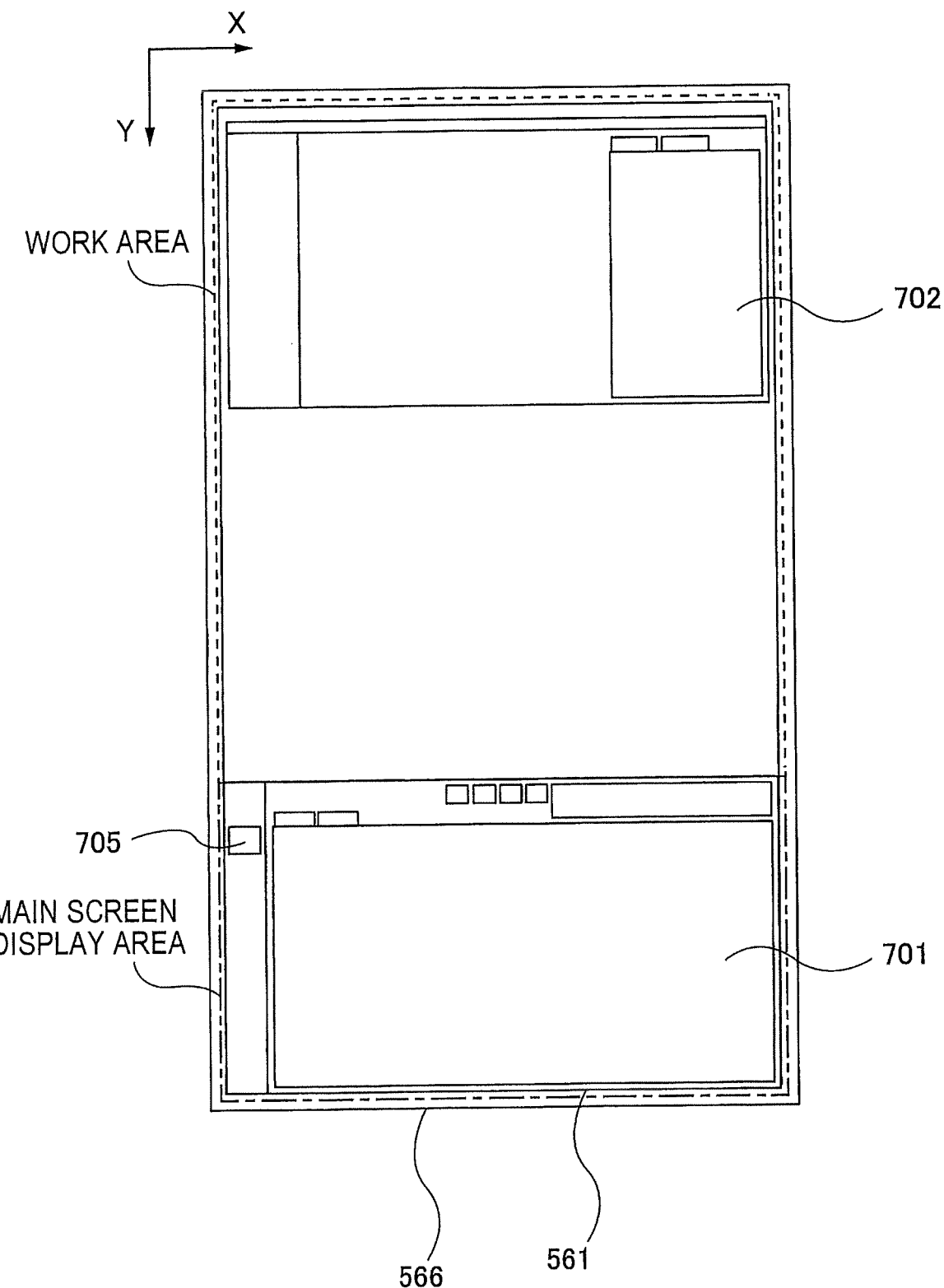
FIG. 13 is a view showing the main screen display area arranged in a lower portion of the display area of the display screen.

As shown in FIG. 13, the controller 5 may arrange the main screen display area in the lower portion of the display area of the display screen 561. In FIG. 13, the work area is arranged in the upper portion and the central portion of the display area of the display screen 561. The work area arranged in the upper portion and the central portion of the display screen 561 is one area.

According to the embodiment, when the display screen 561 is the vertical screen, the display area of the display screen 561 can be divided into the main screen display area and the work area. Therefore, the user can operate the operation image 702 displayed in the work area to control the operation of the processing unit, while monitoring the monitoring image 701 displayed in the main screen display area. As a result, even when there are a plurality of management matters with respect to the semiconductor manufacturing apparatus, the user can manage the management matters simultaneously. In this manner, the user-friendliness with respect to the semiconductor manufacturing apparatus can be improved.

The semiconductor manufacturing apparatus according to the embodiment can exert its effect particularly when the wafers are processed in parallel. More specifically, when the wafers are simultaneous parallel processed independently, the user can manage the progress of one processing wafer through the monitoring image 701 and perform the operation with respect to another processing wafer in the work area by dividing the display area of the display screen 561 into the main screen display area and the work area.

According to the embodiment, the main screen display area and the work area are completely divided, and the monitoring image 701 and the operation image 702 are displayed in the main screen display area and the work area, respectively, so as not to overlap each other. Therefore, good operability and good visibility of these images 701, 702 are obtained.

For example, in a case of dividing the display area of the display screen 561 which is the horizontal screen into the main screen display area and the work area, the size of the monitoring image 701 has to be greatly reduced. As a result, the visibility of the monitoring image 701 is deteriorated. If the size of the monitoring image 701 is slightly reduced in order to ensure the visibility of the monitoring image 701, it is difficult to ensure the work area having sufficient size. Therefore, the operability of the operation image 702 is deteriorated. In the embodiment, when the display screen 561 is the vertical screen, the monitoring image 701 is displayed in the main screen display area while the aspect ratio of the monitoring image 701 is maintained. Therefore, the work area having sufficient size can be ensured in the display area of the display screen 561.

When the display screen 561 is the vertical screen, the monitoring image 701 and the operation image 702 are arranged in series along the vertical direction (height direction) of the display image 561, so that the user can easily view the images 701, 702. Furthermore, with such an arrangement, the user does not need to move the input device 530 (more specifically, the mouse) largely, so that the operability by the user can be improved.

The display device 560 may be arranged in a narrow space between the processing unit and the processing unit depending on an installation environment of the semiconductor manufacturing apparatus. According to the embodiment, the display area of the display screen 561 can be divided into the main screen display area and the work area by disposing the display screen 601 in the vertical direction. Therefore, more information can be displayed in the display screen 561 while reducing a footprint.

When switching the display screen 561 from the vertical screen to the horizontal screen, the controller 5 displays the monitoring image 701 in the main screen display area by performing the same steps as in FIG. 8. The controller 5 automatically regulates (change) the size of the monitoring image 701 while the aspect ratio of the monitoring image 701 (see FIG. 11) displayed in the main screen display area when the display screen 561 is the vertical screen to display the monitoring image 701 in the main screen display area when the display image 561 is the horizontal screen.

The controller 5 may display a main menu (i.e., main menu button) 705 which aggregates the operation images 702 in a portion of the main screen display area (in this embodiment, a left side of the monitoring image 701) (see FIG. 9, FIG. 11, FIG. 12, and FIG. 13). In the embodiment, the main menu 705 is incorporated in the monitoring image 701. In one embodiment, the controller 5 may hide the main menu 705 and cause the main menu 705 to appear according to the operation by the user.

Figure 14:
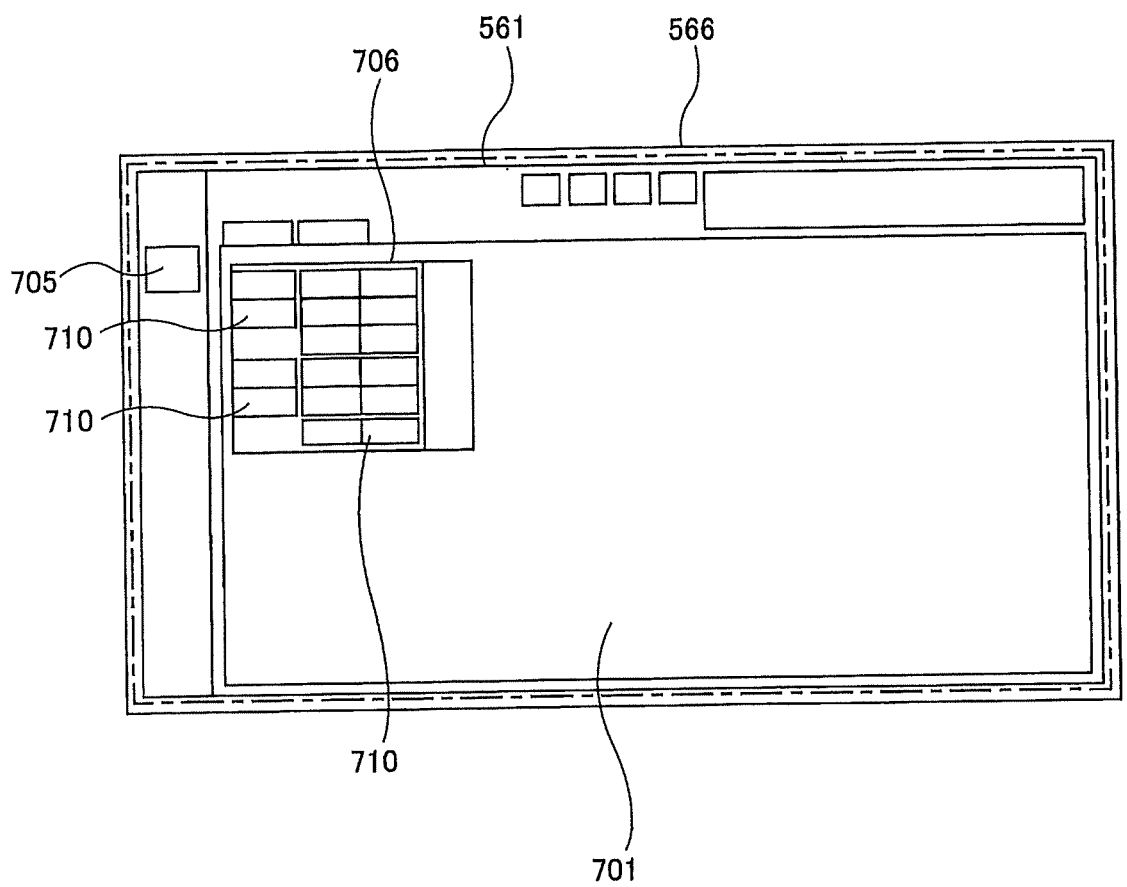
FIG. 14 is a view showing a sub menu which is a lower level menu of a main menu.

FIG. 14 is a view showing a sub menu (i.e., sub menu button) 706 which is a lower level menu of the main menu 705. In FIG. 14, the display screen 561 is the horizontal screen. The operation images 702 are aggregated in the sub menu 706, and the operation images 702 are displayed as image-call buttons 710, respectively.

As shown in FIG. 14, the image-call buttons 710 are each arranged side-by-side so as not to overlap each other. When the user selects at least one of the image-call buttons 710, the operation image 702 corresponding to the selected image-call button 710 is displayed in the display area of the display screen 561.

Figure 15:
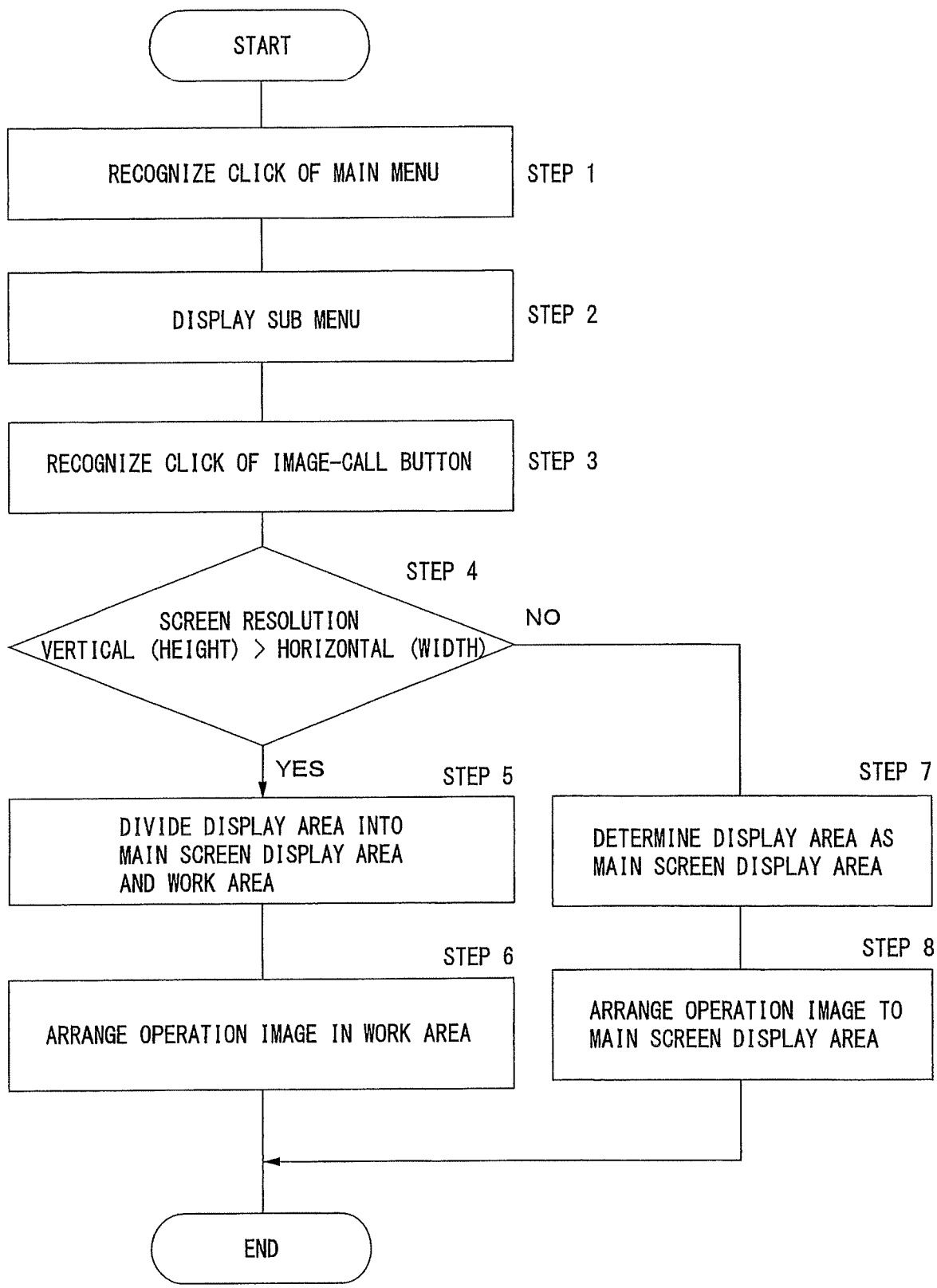
FIG. 15 is a view showing a process flow of the controller when a operation image is displayed in the display area of the display screen.

FIG. 15 is a view showing a process flow of the controller 5 when the operation image 702 is displayed in the display area of the display screen 561. When the user selects the main menu 705 by operating the input device 530 (keyboard operation or mouse-click operation) (hereinafter, the "select" may be referred to as "click" for the convenience of description), the controller 5 recognizes a selection of the main menu 705 (see step 1 in FIG. 15). Thereafter, the controller 5 displays the sub menu 706 in the display area of the display screen 561 (see step 2 in FIG. 15).

In FIG. 14, the sub menu 706 is arranged adjacent to the main menu 705 so as not to overlap with the main menu 705. Therefore, the sub menu 706 is displayed in the portion of the main screen display area so as to overlap a portion of the monitoring image 701.

After the step 2 in FIG. 15, when the user clicks at least one of the image-call buttons 710 in the sub menu 706 by operating the input device 530, i.e., when the user selects at least one of the operation images 702 aggregated in the sub menu 706, the controller 5 recognizes the selection of the image-call button 710 (see step 3 in FIG. 15).

Thereafter, the controller 5 judges whether or not the vertical screen resolution of the display screen 561 is larger than the horizontal screen resolution of the display screen 561 (see step 4 in FIG. 15). When the vertical screen resolution of the display screen 561 is larger than the horizontal screen resolution of the display screen 561 (see "YES" of step 4 in FIG. 15), the controller 5 determines this, and divides the display area of the display screen 561 into the main screen display area and the work area (see step 5 in FIG. 15) to display the operation image 702 selected by the operation of the user in the work area (step 6 in FIG. 15).

When the user clicks the image-call button 710 a plurality of times to select the operation images 702, the controller 5 displays the operation images 702 in the work area. As described above, the user can change the size and/or the arrangement position of the operation image 702 in the work area. Therefore, the user can regulates (magnify or reduce) the size of the arbitrary operation image 702 selected from the images 702, and can change the arrangement position of the operation image 702.

When the vertical screen resolution of the display screen 561 is smaller than the horizontal screen resolution of the display screen 561 (see "NO" of step 4 in FIG. 15), the controller 5 determines this, and determines the entire display area of the display screen 561 as the main screen display area (see step 7 in FIG. 15) to display the operation image 702 selected by the operation of the user in the main screen display area (see step 8 in FIG. 15).

Figure 16:
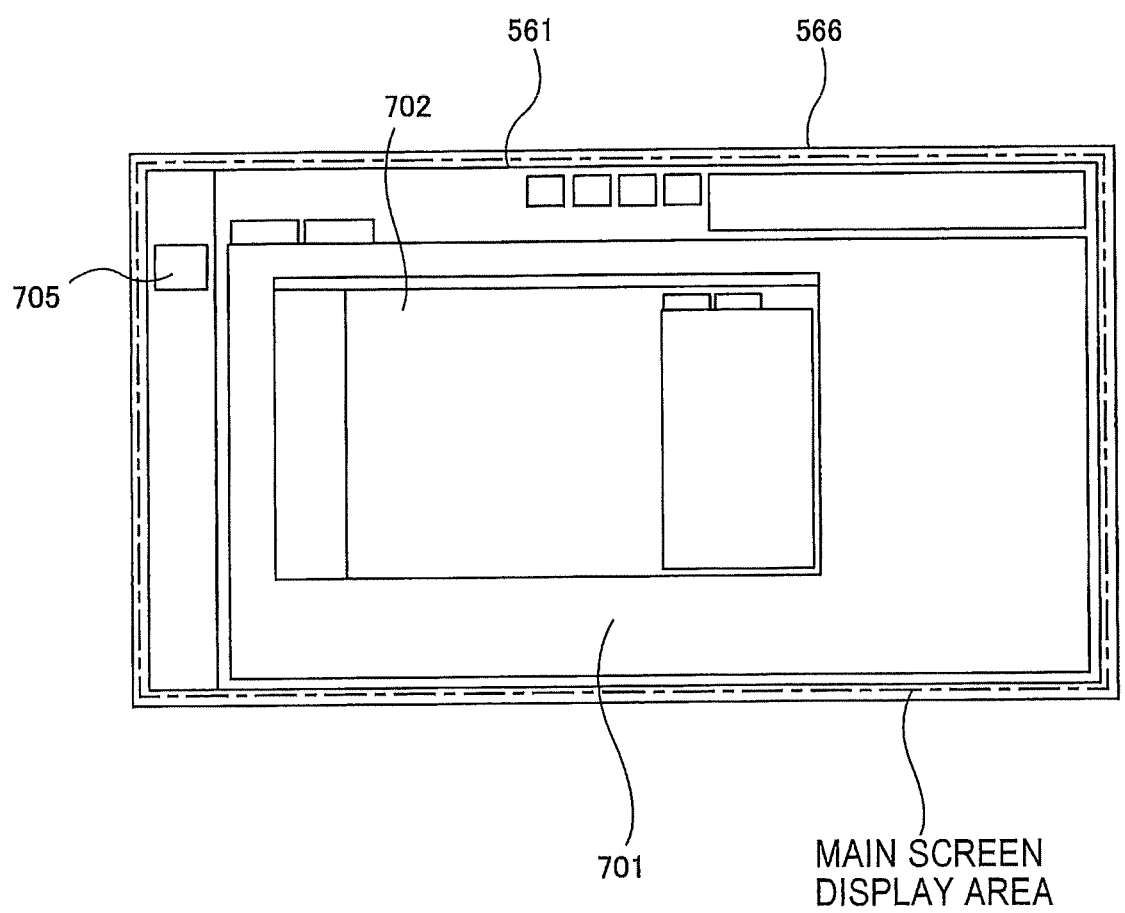
FIG. 16 is a view showing the operation image displayed in the main screen display area.

FIG. 16 is a view showing the operation image 702 displayed in the main screen display area. In FIG. 16, the operation image 702 is arranged on the monitoring image 701 in the main screen display area so as to overlap the portion of the monitoring image 701. The controller 5 can change the size and/or the arrangement position of the operation image 702 in the main screen display area according to the operation of the user.

The operation images 702 are aggregated in the sub menu 706 as the image-call button 710, and the sub menu 706 is displayed in the portion of the main screen display area by selecting the main menu 705 smaller than the sub menu 706. In this manner, since the main menu 705 smaller than the sub menu 706 is displayed in the portion of the main screen display area, the monitoring image 701 displayed on the main screen display area can be displayed larger.

The same image as the operation image 702 may be displayed in a display screen of the terminal device T1 (see FIG. 5) connected to the controller 5 through the network 250. Therefore, the user can display at least one operation image 702 in the display screen of the terminal device T1 by using the terminal device T1. The terminal device T1 operates the processing unit according to the operation of the user to control the operation of the processing unit. In one embodiment, the same image as the monitoring image 701 may be displayed in the display screen of the terminal device T1.

A plurality of users can control the processing units simultaneously by using the display device 560 and the terminal device T1. Therefore, for example, if one user operates the same processing unit through the display device 560 when another user is operating the processing unit through the terminal device T1, there is a possibility that the operated processing unit performs an unexpected operation.

Thus, in order to prevent the unexpected operation of the processing unit, the controller 5 has an interlock function which does not allow any one of the controller 5 and the terminal device T1 to operate any one of the processing units simultaneously. In one embodiment, the first computer 501 can also function as a control tower having an interlock function.

Details of the interlock function are as follows. The terminal device T1 requests an exclusive manipulation right from the controller 5. The exclusive manipulation right is a right for exclusively manipulating at least one processing unit selected from the processing units. In response to the request from the terminal device T1, the controller 5 establishes an exclusive manipulation right for the selected processing unit. Similarly, the controller 5 establishes an exclusive manipulation right for enabling the controller 5 itself to exclusively manipulate at least one processing unit selected from the processing units, unless an exclusive manipulation right has already been established for the selected processing unit.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A non-transitory computer-readable storage medium storing a program configured to cause a computer to control a display device comprising a rectangular display screen configured to display an image with respect to a processing unit, the program, upon execution, causing the computer to perform operations comprising:
   dividing a display area of the rectangular display screen into a main screen display area and a work display area when a vertical screen resolution of the rectangular display screen is determined to be larger than a horizontal screen resolution of the display screen;
   displaying a menu aggregating a plurality of operation images in the main screen display area wherein an operation image of the plurality of image to display operation of the processing unit;
   displaying a monitoring image in the main screen display area to monitor operational status of the processing unit and displaying a selected operation image among the plurality of operation images in the work area in response to a determination that the vertical screen resolution is larger than the horizontal screen resolution; and
   determining the display area as the main screen display area when the vertical screen resolution of the rectangular display screen is smaller than the horizontal screen resolution and displaying the selected operation image in the main screen display area.

2. The storage medium according to claim 1, wherein the program further causes the computer to perform operations of:
   determining whether the vertical screen resolution is larger than the horizontal screen resolution; and
   determining the display area as the main screen display area when the vertical screen resolution is smaller than the horizontal screen resolution.

3. The storage medium according to claim 1, wherein the program further causes the computer to perform an operation of:
   changing a size and/or an arrangement position of the operation image in the work area according to an input of the user.

4. A semiconductor manufacturing apparatus comprising:
   a processing unit configured to perform a designated operation against a substrate; and
   a display control system comprising a controller configured to control the designated operation of the processing unit,
   wherein the controller comprises:
   a memory in which a program is stored;
   a processing device coupled to the memory;
   a display device comprising a rectangular display screen;
   an input device configured to input information for performing the program;
   upon execution of the program by the processing device causing the controller at least to:
   divide a display area of the rectangular display screen into a main screen display area and a work display area when a vertical screen resolution of the rectangular display screen is determined to be larger than a horizontal screen resolution of the display screen;
   display a menu aggregating a plurality of operation images in the main screen display area wherein an operation image of the plurality of image to display operation of the processing unit;
   display a monitoring image in the main screen display area to monitor operational status of the processing unit and displaying a selected operation image among the plurality of operation images in the work area in response to a determination that the vertical screen resolution is larger than the horizontal screen resolution; and
   determine the display area as the main screen display area when the vertical screen resolution of the rectangular display screen is smaller than the horizontal screen resolution and displaying the selected operation image in the main screen display area.

5. The semiconductor manufacturing apparatus according to claim 4, wherein the display control system comprises:
   a terminal device configured to control the designated operation of the processing unit separately from the controller; and
   a network configured to connect the processing unit, the controller, and the terminal device.

6. The semiconductor manufacturing apparatus according to claim 5, wherein the controller has an interlock function which does not allow any one of the controller and the terminal device to control the processing unit simultaneously.

7. The semiconductor manufacturing apparatus according to claim 5, wherein the controller and the terminal device each have a synchronization function configured to synchronize data shared by the controller and the terminal device through the network.

8. The semiconductor manufacturing apparatus according to claim 5, wherein the controller and the terminal device each have a backup function configured to automatically backup data shared by the controller and the terminal device through the network.

* * * * *